US006807591B2

(12) United States Patent
Kao

(10) Patent No.: US 6,807,591 B2
(45) Date of Patent: Oct. 19, 2004

(54) METHOD AND APPARATUS FOR PLAYING MULTI-FUNCTION DEVICE

(76) Inventor: Chia-Hung Kao, 5f., No. 22, Aly. 3, Lan 289, Chuang-Ching Rd., Taipei (TW), 110

( * ) Notice: Subject to any disclaimer, the term of this patent is extended or adjusted under 35 U.S.C. 154(b) by 0 days.

(21) Appl. No.: 10/318,148

(22) Filed: Dec. 13, 2002

(65) Prior Publication Data

US 2004/0059847 A1 Mar. 25, 2004

(51) Int. Cl.[7] .............................................. G06F 13/12
(52) U.S. Cl. ................................. 710/74; 76/62; 76/64
(58) Field of Search .................... 710/62–64, 72–74, 710/8, 13

(56) References Cited

U.S. PATENT DOCUMENTS

| | | | |
|---|---|---|---|
| 6,658,202 B1 | * 12/2003 | Battaglia et al. | ............. 386/117 |
| 6,671,808 B1 | * 12/2003 | Abbott et al. | ................ 713/200 |
| 2002/0030744 A1 | * 3/2002 | Sawachi | ...................... 348/207 |
| 2002/0133659 A1 | 9/2002 | Tree et al. | ................... 210/500 |
| 2002/0149695 A1 | * 10/2002 | Kayanuma | ................... 348/375 |

FOREIGN PATENT DOCUMENTS

WO        WO 02/82273 A1      10/2002

* cited by examiner

*Primary Examiner*—Jeffrey Gaffin
*Assistant Examiner*—Alan S Chen
(74) *Attorney, Agent, or Firm*—Troxell Law Office PLLC

(57) ABSTRACT

The present invention provides a method and an apparatus for playing multi-function device are offered to enable an data processor to amplify the broadcasting power and perform stereophony by the means of a speaker set. This apparatus for playing multi-function device includes an data processor, a monitor, a modulation circuit, an amplification circuit, a speaker set, an audio output plug, a first universal serial bus socket, a second universal serial bus socket, a control panel, and a housing. The connecting method of this invention is to insert an data processor into a rectangle tank, conjoin a universal serial bus connector and a universal serial bus socket, and then, connect an audio output plug to an audio output socket. A back-to-forth of the forgoing connecting method can remove the data processor.

2 Claims, 7 Drawing Sheets

METHOD AND APPARATUS FOR PLAYING MULTI-FUNCTION DEVICE

FIELD OF THE INVENTION

This invention relates to a method and an apparatus for playing multi-function device and more particularly to the audio player of the data processor.

BACKGROUND OF THE INVENTION

Due to the continuous development of digital technology, MP3 players (MEPG Audio Layer-3, MP3) and digital recorders are designed light and small for easily portable. Therefore, monotonic and low-power speaker sets are used to be corresponded to the design, the quality of the sound not under consideration. As a result, this invention providing a method and an apparatus for playing multi-function device is desirable to perform stereophony as from a high-power speaker set by the means of an data processor.

Generally, two defects of a conventional data processor are, as FIG. 1 shows, the speaker set 10 can only deliver one-tone with limited output power; and, the data processor 1a itself, a delicate electronic product, can be easily damaged by the change of the surroundings. As a result, a method and an apparatus for playing multi-function device with additional utilities as a radio and a storage box are invented not only to improve the function of the multi-function device that carries out stereophony and high-power broadcasting efficiency, but also to extend the useful life of the data processor.

OBJECTS OF THIS INVENTION

The main object of the present invention is to provide an apparatus that can be applied to all kinds of date processors, stereo phoning and high-power broadcasting.

Another object of this invention is to provide a second universal serial bus socket as a connection to a computer. The other object of this invention is to provide storage space for data processor.

SUMMARY OF THE INVENTION

The present invention provides a apparatus, which comprises an data processor, consisting of multi-functions as digital recorder, data saver, MP3 player card reader, and a universal serial bus connector and an audio output socket; a monitor, displaying the data-processing condition; a modulation circuit, modifying the output sound from said processor consequently to first audio; an amplification circuit, amplifying the first audio into second audio; a speaker set, broadcasting the second audio; an audio output plug, plugged into the output socket on said processor and transmitting said output sound to said modulation circuit; a first universal serial bus socket, providing said monitor to show the data-processing condition by being connected to said universal serial bus connector on said processor; a second universal serial bus socket, used to transmit data between said processor and a computer and to connect with said first universal serial bus socket; a control panel, consisting of a plurality of control buttons for operation; and a housing, used to conserve said data processor, said speaker set, said monitor, said modulation circuit, said amplification circuit, said audio output plug, said first universal serial bus socket, said second universal serial bus socket, and said control panel.

BRIEF DESCRIPTION OF THE DRAWINGS

The present invention will be better understood from the following detailed description of preferred embodiments of the invention, taken in conjunction with the accompanying drawing, in which.

DESCRIPTION OF THE PREFERRED EMBODIMENTS

Referring now to the accompanying drawings, the preferred embodiment of a skill, a method, and a concrete structure for accomplishing the above-mentioned objects, according to the present invention, will be described in detail hereinafter.

Figure 1:
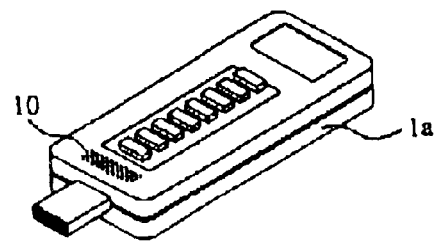
FIG. 1 is a perspective view of a conventional data processor according to the present invention.
Figure 2A:
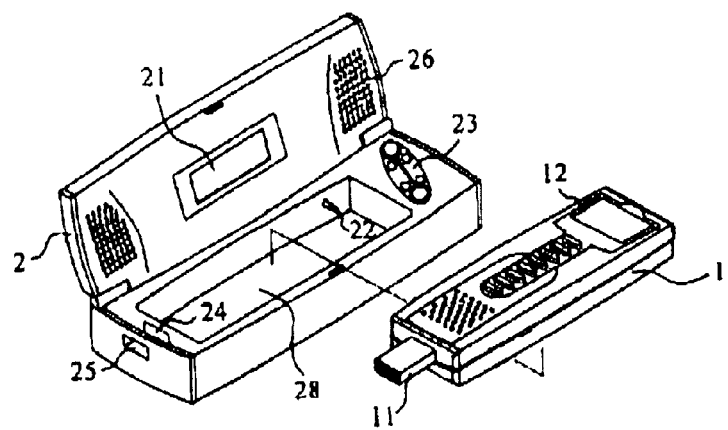
FIG. 2A is a perspective view of an apparatus before assembled according to present invention.
Figure 2B:
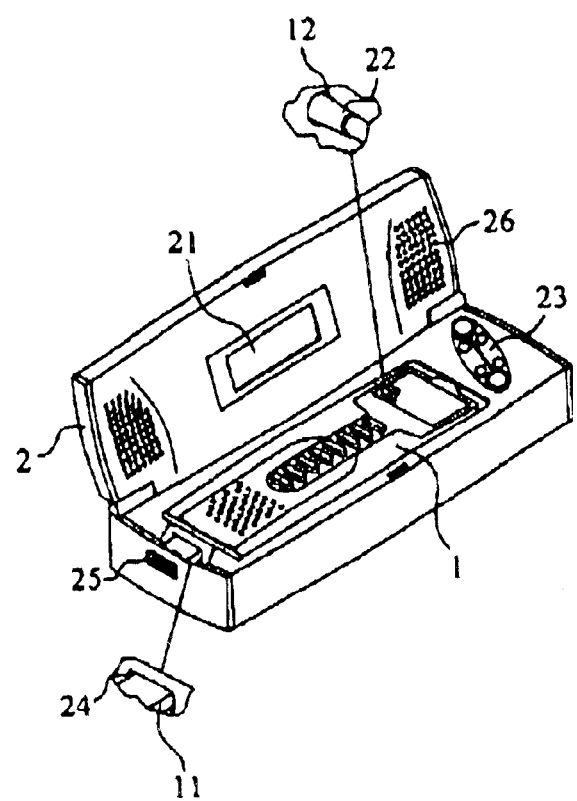
FIG. 2B is a perspective view of an apparatus after assembled according to present invention.
Figure 3:
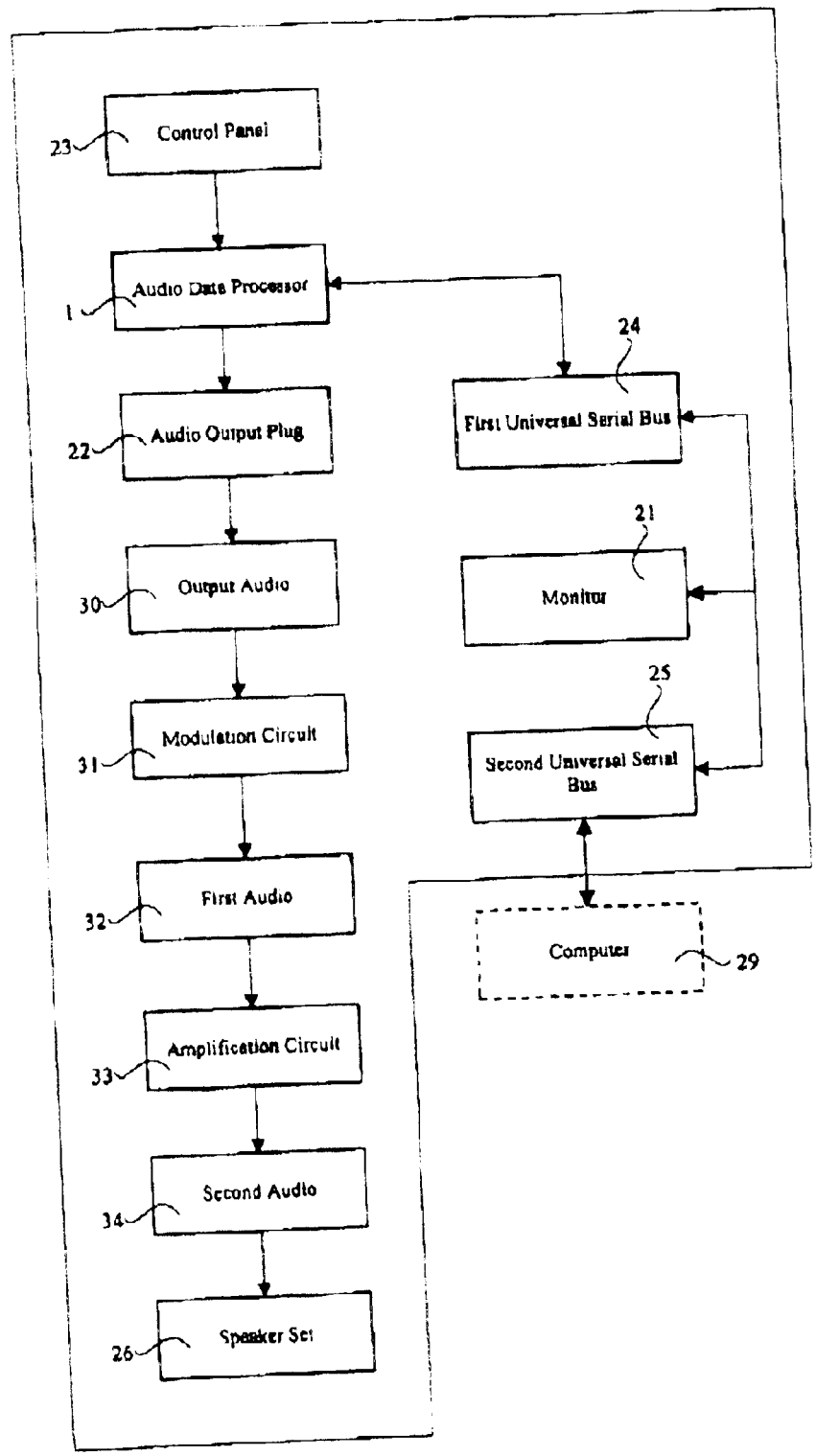
FIG. 3 is a block diagram of circuit structure of an apparatus according to present invention.

First, referring to FIG. 2a, FIG. 2b, and FIG. 3, illustrate a apparatus, which comprises data processor 1, consisting of multi-functions as digital recorder, data saver, MP3 player and card reader, and universal serial bus connector 11 and audio output socket 12; monitor 21, displaying the data-processing condition of said processor 1; modulation circuit 31, modifying the output sound 30 from said processor 1 consequently to first audio 32; amplification circuit 33, amplifying first audio 32 into second audio 34; speaker set 26, broadcasting second audio 34; audio output plug 22, plugged into output socket 12 on said processor 1 and transmitting said output sound 30 to said modulation circuit 31; first universal serial bus socket 24, providing said monitor 21 to display the data-processing condition by being connected to said universal serial bus connector 11 on said processor 1; second universal serial bus socket 25, used to transmit the data of said processor 1 to computer 29 and to connect with first universal serial bus socket 24; control panel 23, consisting of a plurality of control buttons for operation; and housing 2, used to conserve said date processor 1, said speaker set 26, said monitor 21, said modulation circuit 31, said amplification circuit 33, said audio output plug 22, said first universal serial bus socket 24, said second universal serial bus socket 25, and said control panel 23. The connecting method of this invention is to insert data processor 1 into rectangle tank 28, conjoin universal serial bus connector 11 and first universal serial bus socket 24, and then, connect audio output plug 22 to audio output socket 12. A back-to-forth of the forgoing connecting method can remove the data processor.

Figure 2C:
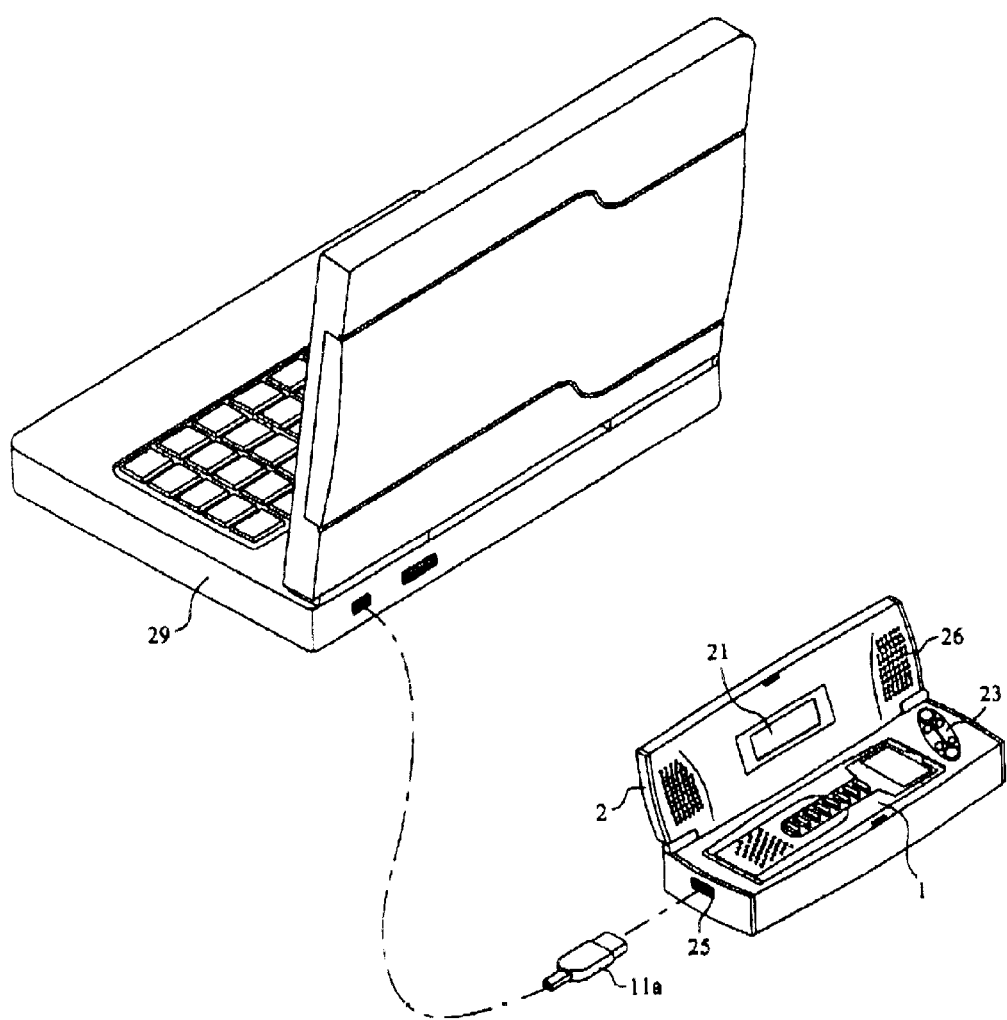
FIG. 2C is a perspective view of an apparatus connected to a computer according to present invention.

According to FIG. 2c, illustrating the connection of the replaceable audio processor and computer 29, the data of the computer 29 can be delivered to data processor 1 by connecting with, according to the present invention, second universal serial bus socket 25 and external universal serial bus connector 11a. Moreover, a apparatus according to the present invention wherein said monitor is selected from the group of liquid crystal display (LCD), polymer light-emitting diode (PLED), and organic light-emitting diode (OLED). Another mechanism of universal serial bus connector 11 on said data processor 1, electrostriction, allows said connector 11 automatically popping out to first universal serial bus socket 24 and transmitting data when in operation, and ensconces said connector 11 in said data processor 1 when in dormant. Beside of the above utilities, further functions as a radio, a digital clock, an alarm, and storage for said processor 1 are also concluded in the present invention.

Referring now to FIG. 3 it is a block diagram of circuit structure of a apparatus according to present invention. Control panel 23 thereof. Is used for operating play, selection and stop functions, and data processor 1 is in charge of delivering data through audio output plug 22 and first universal serial bus socket 24 wherein the processing data is separately delivered into two signals. One is the sound signal, output sound 30 passed by said audio output plug 22, which turns to first audio 32 after transmitted via modulation circuit 31, then becomes second audio 34 after transmitted via amplification circuit 33, and finally is broadcasted by speaker set 26. The other is the word/graph/image signal, transmitted via first universal serial bus socket 24 and shown on monitor 21. Additionally, by the means of the connection of first 24 and second 25 universal serial bus sockets, data-processing condition between computer 29 and data processor 1 is also shown on monitor 21.

Figure 4:
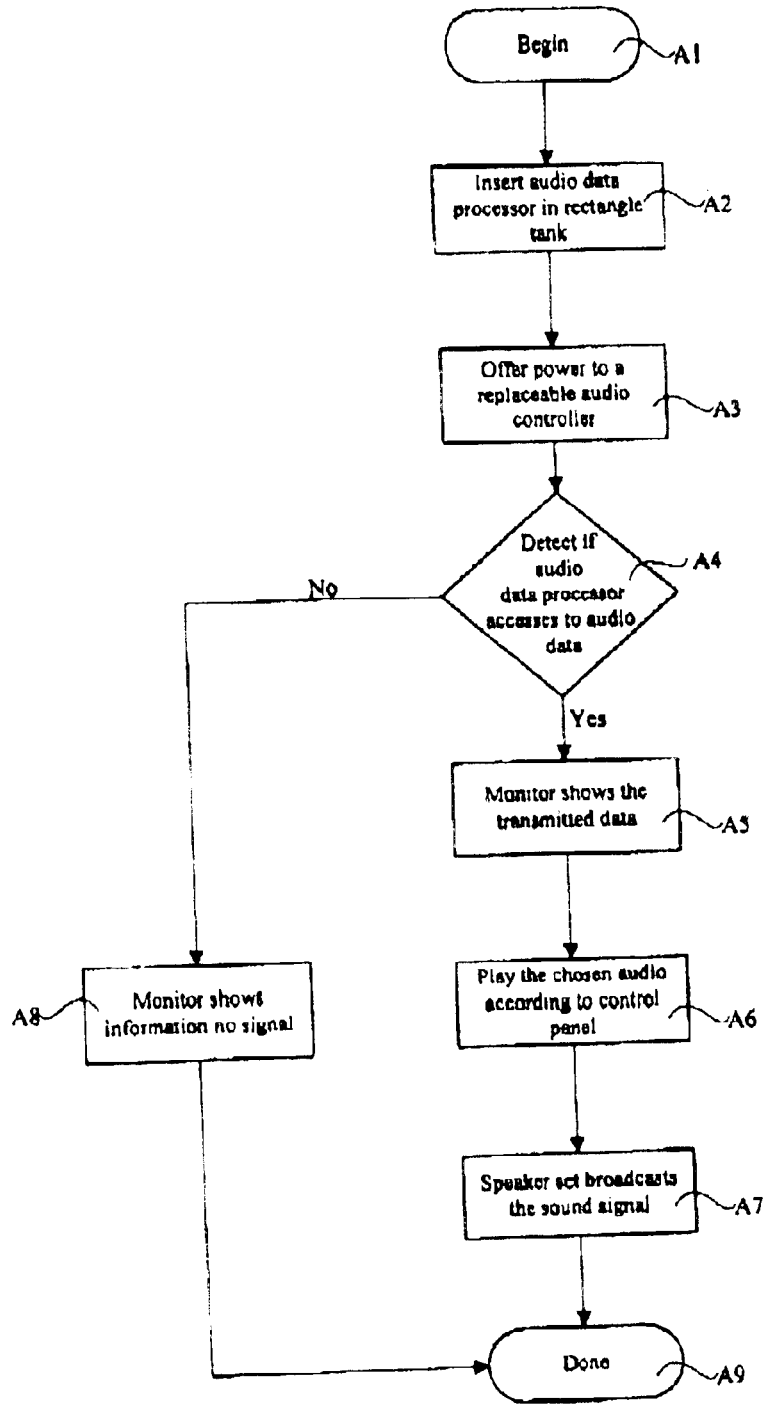
FIG. 4 is a flowchart of operation of an apparatus according to present invention.
Figure 5:
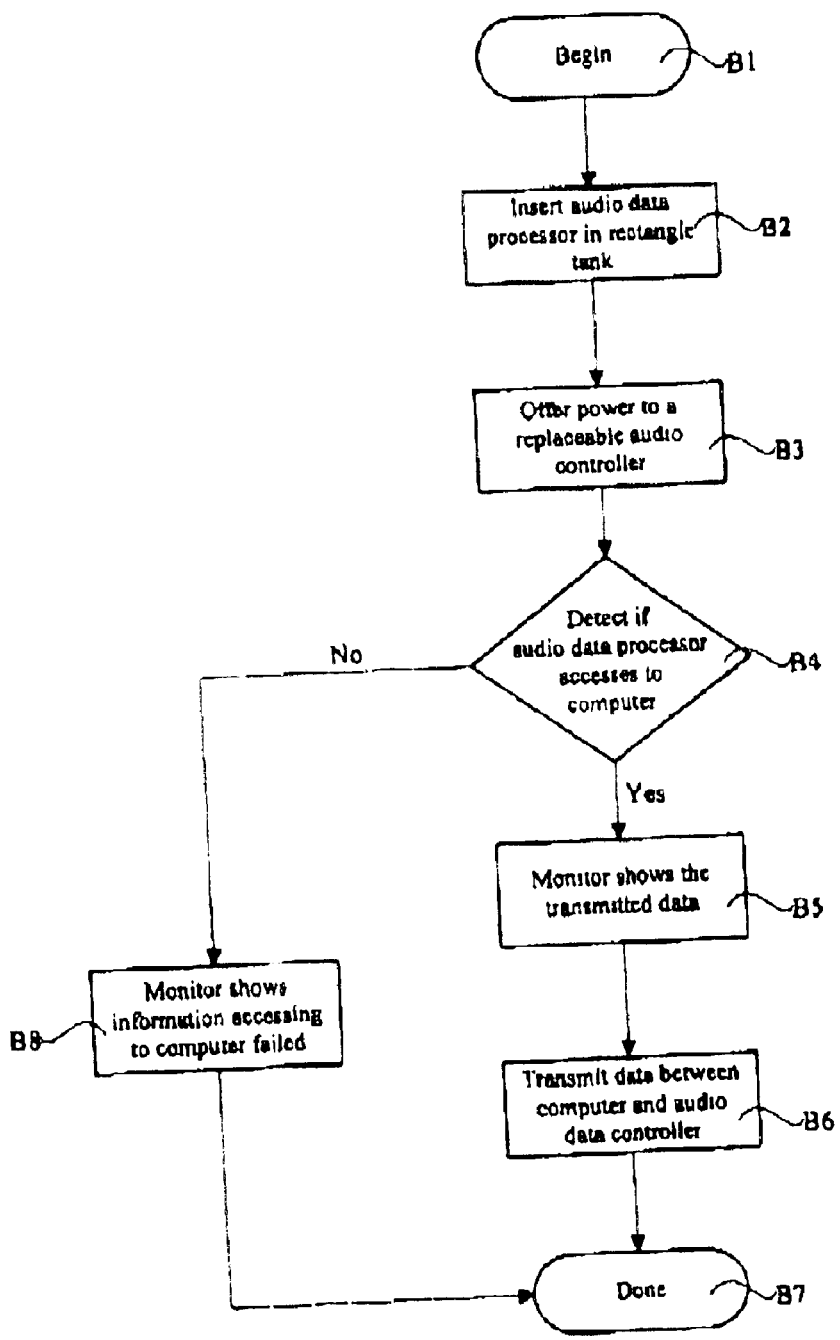
FIG. 5 is a flowchart of operation of the data transmission between an apparatus and a computer according to the present invention.

In order to have a thorough understanding about how to operate a apparatus according to the present invention, flowcharts FIG. 4 and FIG. 5 corresponding to the description hereafter will explain by degrees the operation steps of a apparatus.

First referring to FIG. 4 it is an embodiment of operation methods of a apparatus in the present invention wherein each operation step is described hereafter:

(A1) Begin (A2) Insert data processor 1 in rectangle tank 28

(A3) Offer power to a apparatus (A4) Detect if data processor 1 accesses to audio data; if yes, go to step (A5); if not, go to (A8-(A9)

(A5) Monitor 21 shows the transmitted data (A6) Play the chosen audio according to control panel 23

(A7) Speaker set 26 broadcasts the sound signal (A9) Done (A8) Monitor 21 shows information no signal FIG. 5 illustrates an embodiment of how the external computer of a apparatus delivers audio according to the present invention.

(B1) Begin (B2) Insert data processor 1 in rectangle tank 28

(B3) Offer power to a apparatus (B4) Detect if data processor 1 accesses to computer 29; if yes, go to step (B5); if not, go to (B8)-(B7)

(B5) Monitor 21 shown the transmitted data (B6) Transmit data between computer 29 and audio data controller 1

(B7) Done (B8) Monitor 21 shows information accessing to computer 29 failed

Learning from the foregoing description, not only can the apparatus in the present invention transmit audio from data processor 1 to speaker set 26, but it also can connect with computer 29 by the means of second universal serial bus socket 25. Meanwhile, the present invention, comprising utilities as a radio and storage for data processor 1, can greatly improve user convenience; therefore, the present invention is indeed an outstanding and excellent design, wherein the patent application will be issued according to patent application conditions whereby the present invention hasn't been published or public used.

The present invention may be embodied in other specific forms without departing from the spirit of the essential attributes thereof; therefore, the illustrated embodiment should be considered in all respects as illustrative and not restrictive, reference being made to the appended claims rather than to the foregoing description to indicate the scope of the invention.

What is claimed is:

1. An apparatus for playing multi-function device, comprising:
   a) a data processor comprising digital recorder, data saver, MP3 player and card reader, a universal serial bus connector and an audio output socket; and
   b) a housing having:
      i) a monitor showing data-processing condition;
      ii) a modulation circuit modifying the output sound from said data processor consequently to first audio;
      iii) an amplification circuit amplifying said first audio into second audio;
      iv) a speaker set, broadcasting said second audio;
      v) an audio output plug plugged into the output socket on said data processor and transmitting output sound to said modulation circuit;
      vi) a first universal serial bus socket providing said monitor to show the data-processing condition by being connected to said universal serial bus connector on said data processor;
      vii) a second universal serial bus socket used to transmit data between said data processor and a computer and to connect with said first universal serial bus socket; and
      viii) a control panel comprising a plurality of control buttons for operation.

2. An apparatus for playing multi-function device according to claim 1 wherein said monitor is selected from the group consisting of liquid crystal display (LCD), polymer light-emitting diode (PLED), and organic light-emitting diode (OLED).

* * * * *